US012018139B2

(12) United States Patent
Disson et al.

(10) Patent No.: US 12,018,139 B2
(45) Date of Patent: Jun. 25, 2024

(54) USE OF A MIXTURE OF ORGANIC PEROXIDES FOR CROSSLINKING A POLYOLEFIN ELASTOMER

(71) Applicant: Arkema France, Colombes (FR)

(72) Inventors: Jean-Pierre Disson, Vernaison (FR); Chao Lu, Changshu Jiangsu (CN)

(73) Assignee: Arkema France, Colombes (FR)

( * ) Notice: Subject to any disclaimer, the term of this patent is extended or adjusted under 35 U.S.C. 154(b) by 873 days.

(21) Appl. No.: 16/770,169

(22) PCT Filed: Dec. 14, 2018

(86) PCT No.: PCT/FR2018/053299
§ 371 (c)(1),
(2) Date: Jun. 5, 2020

(87) PCT Pub. No.: WO2019/115975
PCT Pub. Date: Jun. 20, 2019

(65) Prior Publication Data
US 2020/0385545 A1 Dec. 10, 2020

(30) Foreign Application Priority Data
Dec. 15, 2017 (FR) ...................................... 1762257

(51) Int. Cl.
| | |
|---|---|
| *C08K 5/14* | (2006.01) |
| *H01L 31/048* | (2014.01) |
| *H01L 31/18* | (2006.01) |
| *C08G 18/86* | (2006.01) |
| *C08L 83/04* | (2006.01) |

(52) U.S. Cl.
CPC ............ *C08K 5/14* (2013.01); *H01L 31/0481* (2013.01); *H01L 31/18* (2013.01); *C08G 18/86* (2013.01); *C08K 2201/014* (2013.01); *C08K 2201/019* (2013.01); *C08L 83/04* (2013.01)

(58) Field of Classification Search
CPC ................ C08K 5/14; C08K 2201/014; C08K 2201/019; C08K 5/0025; C08K 5/34924; H01L 31/0481; H01L 31/18; C08L 23/0815; C08L 83/04; C08G 18/86
See application file for complete search history.

(56) References Cited

U.S. PATENT DOCUMENTS

| | | | | |
|---|---|---|---|---|
| 3,344,126 A | * | 9/1967 | Witman | ................... C08K 5/14 |
| | | | | 525/332.5 |
| 5,272,236 A | | 12/1993 | Lai et al. | |
| 5,278,272 A | | 1/1994 | Lai et al. | |
| 5,986,028 A | | 11/1999 | Lai et al. | |
| 2017/0166726 A1 | | 6/2017 | Defrancisci et al. | |
| 2018/0112061 A1 | * | 4/2018 | Lu | ....................... H01L 31/0481 |

FOREIGN PATENT DOCUMENTS

| | | |
|---|---|---|
| JP | 2011155238 A | 8/2011 |
| JP | 2017085032 A | 5/2017 |
| WO | 2016012718 A1 | 1/2016 |
| WO | 2018046700 A1 | 3/2018 |

OTHER PUBLICATIONS

ISA/EP; International Search Report and Written Opinion for International Patent Application No. PCT/FR2018/053299 dated Mar. 14, 2019, 10 pages.

* cited by examiner

*Primary Examiner* — Patricia D Valenzuela
(74) *Attorney, Agent, or Firm* — NK Patent Law

(57) ABSTRACT

The present invention concerns the use of a mixture of organic peroxides for crosslinking a polyolefin elastomer (POE), in particular intended to be used in photovoltaic applications. The invention also relates to a crosslinkable composition comprising at least one polyolefin elastomer (POE) and at least one mixture of organic peroxides. The present invention also concerns a method for preparing a material made from polyolefin elastomer (POE), preferably an encapsulating material or a sealing agent, in particular for photovoltaic cells, comprising a step of crosslinking a crosslinkable composition as defined previously.

22 Claims, No Drawings

USE OF A MIXTURE OF ORGANIC PEROXIDES FOR CROSSLINKING A POLYOLEFIN ELASTOMER

CROSS-REFERENCE TO RELATED APPLICATIONS

This application is a U.S. National Stage application of International Patent Application No. PCT/FR2018/053299, filed on Dec. 14, 2018, which claims the benefit of French Patent Application No. 1762257, filed on Dec. 15, 2017.

The present invention concerns the use of a mixture of organic peroxides, as defined hereinbelow, for crosslinking polyolefin elastomer (POE), preferably a copolymer of ethylene and at least one alpha-olefin, especially intended to be used in photovoltaic applications.

The invention also pertains to a crosslinkable composition comprising at least one polyolefin elastomer (POE), preferably a copolymer of ethylene and at least one alpha-olefin, and at least one mixture of organic peroxides as defined hereinbelow.

The present invention also relates to a method for producing a material based on polyolefin elastomer (POE), preferably an encapsulating material, particularly for photovoltaic cells, which comprises a step of crosslinking a crosslinkable composition as defined above.

The invention is likewise directed to the material based on polyolefin elastomer, preferably on a copolymer of ethylene and at least one alpha-olefin, which is obtainable by the method described above, and to a photovoltaic module comprising such a material.

The role of photovoltaic modules (also called solar panels or collectors) is generally that of converting incident solar energy into electrical energy so as to produce electricity in the form of continuous current.

A photovoltaic module corresponds especially to an assembly of photovoltaic cells (also called solar cells) which are composed primarily of semiconductors and which are disposed side by side between a first, transparent layer, forming a front face of the module, and a second layer, forming a rear face of the module.

The first layer, forming the front face of the module, is generally made using a solid glass sheet which is transparent so as to allow the photovoltaic cells to receive a luminous flux.

The second layer, forming the rear face of the module (or backing), may be made from a flexible material, plastic for example, or from a glass or metal material. In particular, the front face and the rear face of the module may both be made with a sheet of glass (with the production method then being called a double-glass process). Furthermore, this film is generally colored white with pigments of titanium oxide type optionally in combination with other fillers (of the type of calcium carbonate, talc, silica, etc.), so as to reflect light to the top of the module and so transmit to the cells some of the radiation normally lost in the single-glass panels.

In the case of the single-glass panels, the second layer, forming the rear face of the module, consists preferably of a multilayer assembly composed, for example, of a thin layer of electrical insulation polymer, such as polyethylene terephthalate (PET) or polyamide (PA), on top of which there are one or more thin layers based on fluoropolymers, such as polyvinyl fluoride (PVF) or polyvinylidene fluoride (PVDF), on top of which layer(s) there is layer of metal, for example of aluminum, so as to protect the module from possible mechanical shocks. In that case, the rear face of the module may accordingly be made with a multilayer assembly of this kind, whereas the front face of the module is made with a sheet of glass.

The photovoltaic cells are electrically connected to one another (in series or in parallel) and are encapsulated in order to provide them with electrical insulation and with protection from external environmental factors, such as moisture, weather adversities such as rain or snow, and ultraviolet radiation.

The materials, preferably in the form of films, used for encapsulating photovoltaic cells are currently designed on the basis of homopolymers or copolymers of ethylene. More specifically, copolymers of ethylene and vinyl acetate (EVA) are particularly advantageous for implementing such encapsulation, since they are able to produce transparent materials capable of adhering readily to the substrates of a photovoltaic module, while having a high electrical resistivity. For these reasons, EVA-based resins represent a major part of the current market.

To acquire thermomechanical properties that are satisfactory in light of this application, especially in terms of good adhesion properties with respect to the module substrate, of creep resistance, and of resistance to degradation relative to weather adversities it is important to carry out crosslinking of the ethylene-vinyl acetate copolymers and to obtain a good crosslinking density. Indeed, if the crosslinking density is too low, the resulting material is likely to suffer, among other things, from insufficient tear and breaking resistance, and to flow over time in light of the high temperatures which may be reached by the upper faces of the photovoltaic panels. The crosslinking agents typically employed are peroxides such as dicumyl peroxide (DCP), peroxyesters, peroxyketals, peroxycarbonates, dialkyl peroxides, and mixtures thereof. As an example of monoperoxycarbonate, it is already known practice to use OO-tert-amyl O-2-ethylhexyl monoperoxycarbonate (TAEC), OO-tert-butyl O-2-ethylhexyl monoperoxycarbonate (TBEC), OO-tert-isobutyl O-isopropyl monoperoxycarbonate (TBIC), or 2,5-dimethyl-2,5-di(tert-butylperoxy)hexane for crosslinking ethylene-vinyl acetate (EVA) copolymers.

During the method for producing the photovoltaic module, therefore, the solar cells and their electrical conductors are disposed between two layers (or films) obtained from a composition based on ethylene-vinyl acetate copolymers and one or more crosslinking agents. A production method of this kind includes a single step of laminating the various layers forming the photovoltaic module at a certain temperature for a given period of time during which the EVA-based composition is crosslinked. The various layers of the module are therefore compressed with one another and the solar cells become covered in a transparent EVA-based material.

It has nevertheless been observed that under the effect of ultraviolet radiation and of moisture, the EVA has a tendency to undergo chemical decomposition and to release acetic acid, which accelerates the corrosion of the solar cells and causes yellowing or even browning of the material encapsulating the cells. Such a phenomenon may also induce a change in the transmittance of the incident luminous flux in the solar cells, thereby reducing their power over the long term.

Furthermore, this yellowing defect may be accompanied by deterioration in the properties of adhesion between the encapsulating material and the various layers of the module, resulting, on the one hand, in the penetration of water to the interior of the module and, on the other hand, in the formation of bubbles of air trapped between the encapsulating material and the front and/or rear face of the module. The formation of these air bubbles gives rise to swelling between the encapsulating material and the faces of the module, especially the rear face, so causing the appearance of unattractive visible surface traces (referred to as snail trails). The presence of these bubbles also makes it more difficult to dissipate heat from the solar cells, thereby increasing their overheating and impacting their lifetime. Expressed alternatively, the materials based on EVA have the disadvantage of being permeable under conditions of humid heat.

Moreover, the photovoltaic modules produced with EVA also have the drawback of being particularly sensitive to the gradual deterioration in the electrical properties of the cells, owing to the presence of parasitic leakage currents. This phenomenon is known as potential induced degradation (PID).

In order to overcome the various drawbacks mentioned above, proposals have already been made in the prior art to use compounds other than EVA in order to produce materials employed for the encapsulation of solar cells. As examples, mention may be made in particular of polyvinyl butyrate (PVB), silicone rubber, or polyolefin elastomers (POE), which are of interest for obtaining materials less permeable than those prepared with EVA under conditions of humid heat.

More specifically, the use of polyolefin elastomers proves advantageous for producing materials intended for encapsulating solar cells, since these materials have a high electrical resistivity in tandem with a low permeability under conditions of humid heat. Polyolefin elastomers have good performance properties in particular in photovoltaic modules where the front and rear faces are produced using a sheet of glass.

However, polyolefin elastomers prove more difficult to crosslink than ethylene-vinyl acetate copolymers under identical operating conditions in the presence of the same crosslinking agents. More specifically, the process of crosslinking polyolefin elastomers may in particular require higher crosslinking temperatures, greater concentrations of peroxides, and/or longer crosslinking times than those employed for the ethylene-vinyl acetate copolymers. The result of this is a substantial loss in productivity in those industries utilizing polyolefin elastomers as replacements for ethylene-vinyl acetate copolymers.

To overcome this difficulty, document JP2017-085032 describes the use in photovoltaic applications of copolymers of ethylene and alpha-olefin that are crosslinked in the presence of tert-amylperoxy isopropyl monocarbonate (TAIC). Using a crosslinking agent of this kind enables a rate and a density of crosslinking that are satisfactory by comparison with those obtained for copolymers of ethylene and alpha-olefin under similar operating conditions.

However, tert-amylperoxy isopropyl monocarbonate (TAIC) carries the risk of causing premature crosslinking of the polyolefin elastomers, especially in the barrel or at the head of the extruder, before the step of laminating the various layers serving for manufacture of the photovoltaic module has been implemented. This phenomenon of premature crosslinking (also called scorching) has the consequence of causing the formation of gel particles in the mass of the mixture, which may give rise to a certain number of irregularities (inhomogeneity, surface roughness) of the encapsulating material, eventually impacting on the appearance and the properties of the photovoltaic modules. Moreover, excessive scorching may lead to the complete stoppage of the extrusion process, so slowing down the productivity of the material.

Expressed alternatively, the phenomenon of scorch is liable to impact both on the final properties of the photovoltaic modules and on their productivity.

One of the objectives of the present invention, therefore, is to employ compounds which have good properties for crosslinking polyolefin elastomers, especially conferring a satisfactory crosslinking rate and crosslinking density, to give a material equipped with thermomechanical properties which are appropriate to the desired applications, while minimizing the risks of premature crosslinking (or scorch) which are liable to impact on the productivity and on the final properties of said material.

In other words, a genuine need exists to provide compounds which are capable of effectively crosslinking polyolefin elastomers under operating conditions similar to those employed for ethylene-vinyl acetate copolymers, while minimizing the risks of scorch or of premature crosslinking.

In the light of the above, an objective of the invention more particularly is to provide a material intended for the encapsulation, preferably, of solar cells in photovoltaic modules, this material having not only a high electrical resistivity but also a lower permeability, under conditions of humid heat, than that of a material obtained from ethylene-vinyl acetate copolymers.

The present invention therefore especially provides for the use, for crosslinking a polyolefin elastomer, of a composition comprising:

at least one monoperoxycarbonate conforming to the formula (I):

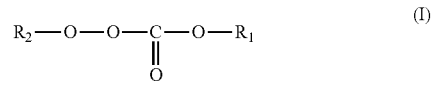

in which formula (I) $R_1$ represents an alkyl radical comprising a number of carbon atoms of less than or equal to 6, and $R_2$ represents an alkyl radical, at least one monoperoxycarbonate, conforming to the formula (II) below:

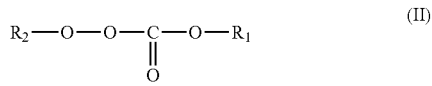

in which formula (II) $R_1$ represents an alkyl radical comprising a number of carbon atoms of greater than or equal to 7, and $R_2$ represents an alkyl radical.

Said composition preferably comprises strictly less than 0.4% by weight of a tert-alkyl hydroperoxide, calculated relative to 100 parts by weight of a mixture of monoperoxycarbonate of formula (I) and monoperoxycarbonate of formula (II). The term "strictly less than 0.4%" means from 0 to 0.4% by weight, the end point 0% being included and the end point 0.4% being excluded.

Said composition is preferably devoid of a tert-alkyl hydroperoxide present in an amount of from 0.4 to less than 4% by weight, calculated relative to 100 parts by weight of a mixture of monoperoxycarbonate of formula (I) and monoperoxycarbonate of formula (II).

Said composition is preferably devoid of a tert-alkyl hydroperoxide present in an amount of from 0.4 to less than 4% by weight, calculated relative to 100 parts by weight of the total monoperoxycarbonate content of the composition. More preferably, said composition is devoid of a tert-alkyl hydroperoxide.

Expressed alternatively, the invention pertains to the use of a mixture of at least two different monoperoxycarbonates conforming respectively to the formulae (I) and (II) for crosslinking a polyolefin elastomer, preferably a copolymer of ethylene and at least one alpha-olefin, the mixture containing strictly less than 0.4% of dialkyl hydroperoxide calculated relative to 100 parts by weight of the mixture.

The composition of the invention thus has the advantage of leading to a satisfactory crosslinking rate and crosslinking density while minimizing the risks of scorch or of premature crosslinking that are capable of impairing the productivity and the end properties of the material obtained.

In other words, the composition of the invention enables an increase in the scorch resistance time without detracting from the overall crosslinking rate and the crosslinking density of the polyolefin elastomers.

More particularly, the composition of the invention enables especially the preservation of the good crosslinking properties obtained with tert-amylperoxy isopropyl monocarbonate, while reducing the risks of premature crosslinking.

Furthermore, the composition of the invention enables effective crosslinking of the polyolefin elastomers, preferably copolymers of ethylene and at least one alpha-olefin, under operating conditions similar to those employed for copolymers of ethylene and vinyl acetate.

The invention also relates to a crosslinkable composition comprising at least one polyolefin elastomer (preferably a copolymer of ethylene and at least one alpha-olefin), at least one monoperoxycarbonate conforming to the formula (I), as described above, and at least one monoperoxycarbonate, different from the monoperoxycarbonate of formula (I), conforming to the formula (II) as described above.

Said composition preferably comprises strictly less than 0.4% by weight of a tert-alkyl hydroperoxide, calculated relative to 100 parts by weight of the mixture of monoperoxycarbonate of formula (I) and monoperoxycarbonate of formula (II). "Strictly less than 0.4%" is understood to mean from 0 to 0.4% by weight, the 0% end point being included and the 0.4% end point being excluded.

Said composition is preferably devoid of a tert-alkyl hydroperoxide present in an amount of from 0.4 to less than 4% by weight, calculated relative to 100 parts by weight of a mixture of monoperoxycarbonate of formula (I) and monoperoxycarbonate of formula (II). Said composition is preferably devoid of a tert-alkyl hydroperoxide present in an amount of from 0.4 to less than 4% by weight, calculated relative to 100 parts by weight of the total monoperoxycarbonate content of the composition. More preferably, said composition is devoid of tert-alkyl hydroperoxide.

The crosslinkable composition of the invention provides access to a material, especially an encapsulating or sealing material, preferably for solar cells, which has thermomechanical properties suitable for the desired applications, with a high productivity.

The crosslinkable composition of the invention thus exhibits the advantage of undergoing crosslinking during a method for producing a photovoltaic module.

Furthermore, the present invention likewise concerns a method for producing a material, comprising a step of crosslinking a crosslinkable composition as defined above.

The method of the invention has the advantage of leading to a material which has good thermomechanical properties, and for which the possible structural roughenings are minimized.

Similarly, another subject of the invention relates to the material comprising at least one polyolefin elastomer (preferably a copolymer of ethylene and at least one alpha-olefin) which is obtainable by the method described above.

The material has the advantage of possessing good electrical resistivity and of being less permeable under conditions of humid heat than materials obtained from ethylene-vinyl acetate copolymers.

Moreover, the material exhibits no (or few) marked surface defects, owing to its scorch resistance.

The material obtained is preferably a material for encapsulating solar cells.

The invention likewise relates to a photovoltaic module comprising such a material encapsulating solar cells.

The photovoltaic module exhibits enhanced properties due to the presence of the encapsulating material.

Other characteristics and advantages of the invention will emerge more clearly on reading the following description and examples.

In the following text, and unless indicated otherwise, the end points of a range of values are included in this range.

The expression "at least one" is equivalent to the expression "one or more".

Use

In accordance with the present invention, the composition as described above allows the crosslinking of polyolefin elastomers, preferably of a copolymer of ethylene and at least one alpha-olefin.

A "polyolefin" in the sense of the present invention means a polymer derived from an olefin—for example, ethylene, propylene, butene, hexene, etc.

"Derived from" in the sense of the present invention means that the units of the main chain of the polymer and/or of the adjacent chains (or pendant chains) of the polymer result from the polymerization or copolymerization of the monomers from which the polymer is made.

"Polyolefin elastomer" (POE) in the sense of the present invention means an elastomeric polymer derived from an olefin—for example, ethylene, propylene, butene, hexene, etc.

"Elastomer" in the sense of the present invention means a polymer which is capable of undergoing a uniaxial deformation, preferably of at least 20%, at ambient temperature over a time of fifteen minutes, and of regaining its initial shape, preferably with a residual deformation of less than 5% relative to its initial shape, when this stress is no longer exerted.

The polyolefin elastomers in accordance with the present invention are advantageously derived from ethylene. In other words, the polyolefin elastomers preferably comprise at least one unit obtained from ethylene.

The polyolefin elastomers in accordance with the present invention preferably further comprise at least one alpha-olefin.

The polyolefin elastomers preferably comprise an amount of at least 15% by weight of alpha-olefin, preferably at least 20% by weight, and more preferably still at least 25% by weight, calculated relative to the total weight of the polymer.

The polyolefin elastomers preferably comprise an alpha-olefin content of less than 50% by weight, preferably less than 45% by weight, and more preferably still less than 35% by weight, calculated relative to the total weight of the polymer.

The polyolefin elastomers may therefore comprise an alpha-olefin content of from 15% to 50% by weight, preferably of from 15% to 45% by weight, better still of from 15% to 35% by weight, even better still from 20% to 35% by weight, calculated relative to the total weight of the polymer.

The alpha-olefin content within the polymer may be measured by carbon-13 nuclear magnetic resonance (NMR) spectroscopy in accordance with the protocol described by Randall (Rev. Macromol Chem. Phys., C29 (2 and 3)).

The alpha-olefin is preferably a linear, branched or cyclic $C_3$-$C_{20}$ alpha-olefin.

Preferably, the alpha-olefin is a linear or branched $C_3$-$C_{20}$ alpha-olefin.

The $C_3$-$C_{20}$ alpha-olefin is preferably selected from the group consisting of propene, 1-butene, 4-methyl-1-pentene, 1-hexene, 1-octene, 1-decene, 1-dodecene, 1-tetradecene, 1-hexadecene and 1-octadecene.

The alpha-olefin may also contain a cyclic structure, cyclohexane or cyclopentane for example, leading to an alpha-olefin such as 3-cyclohexyl-1-propene (allylcyclohexane) and vinylcyclohexane.

Certain cyclic olefins, such as norbornene and the corresponding olefins, are considered to be alpha-olefins in the sense of the present invention and may be used in place of the alpha-olefins described above.

The polyolefin elastomers are advantageously copolymers of ethylene and alpha-olefin, especially a linear or branched $C_3$-$C_{20}$ alpha-olefin.

The polyolefin elastomers are advantageously copolymers of ethylene and at least one alpha-olefin, especially a linear or branched $C_3$-$C_{20}$ alpha-olefin.

The polyolefin elastomers are advantageously copolymers consisting exclusively of ethylene and at least one alpha-olefin, to the exclusion of any other comonomer. The polyolefin elastomers are preferably selected from the group consisting of ethylene/propylene copolymers, ethylene/1-butene copolymers, ethylene/1-hexene copolymers, particularly very-low-density polyethylene (VLDPE) (for example, the ethylene/1-hexene polyethylene sold under the name Flexomer® by Dow Chemical Company), ethylene/1-octene copolymers, ethylene/styrene copolymers, ethylene/propylene/1-octene copolymers, ethylene/propylene/1-butene copolymers, ethylene/1-butene/1-octene copolymers, and ethylene/1-butene/styrene copolymers.

The preferred polyolefin copolymers are selected from the group consisting of linear and uniformly branched copolymers of ethylene and alpha-olefin. Substantially linear ethylene copolymers are particularly preferred and are described especially in U.S. Pat. Nos. 5,272,236, 5,278,272, and 5,986,028.

Examples of linear and uniformly branched copolymers of ethylene and alpha-olefin include the copolymers sold under the name TAFMER® by Mitsui Petrochemicals Company Limited, the name EXACT® by Exxon Chemical Company, and the names AFFINITY® and ENGAGE® by Dow Chemical Company.

The polyolefin elastomers may also include propylene, 1-butene, and other alkylene-based copolymers, for example copolymers comprising a majority of units derived from propylene and a minority of units derived from another alpha-olefin (including ethylene). Examples of polypropylene belonging to the present invention are, in particular, the polymers sold under the trade name VERSIFY® by Dow Chemical Company and the trade name VISTAMAXX® by Exxon Mobil Chemical Company.

The polyolefin elastomers of the invention preferably have a glass transition temperature (Tg) which is less than −35° C., preferably less than −40° C., more preferably less than −45° C., and more preferably still less than −50° C., measured by differential scanning calorimetry (DSC) in accordance with the ASTM D-3418-03 procedure.

The polyolefin elastomers preferably have a melt flow index (MFI) of less than 100 g/10 minutes, preferably less than 75 g/10 minutes, more preferably less than 50 g/10 minutes, and more preferably still less than 35 g/10 minutes.

Advantageously, the polyolefin elastomers have a melt flow index (MFI) of less than 1 g/10 minutes, and more preferably still less than 5 g/10 minutes.

The melt flow index (MFI) of the polyolefin elastomers is measured in accordance with the methods commonly used to characterize thermoplastic materials, providing access to information on the extrudability and also on the shaping possibilities for the material, such as those methods described in standard ASTM D1238, standard NF T51-016 or standard ISO 1133.

The MFI values referred to are determined according to standard ASTM D1238 at a temperature of 190° C. under a load of 2.16 kg (units expressed in g/10 minutes).

The polyolefin elastomers preferably have a density of less than 0.9 g/cc, especially less than 0.89 g/cc, preferably less than 0.885 g/cc, even more preferably less than 0.88 g/cc, and more preferably still less than 0.875 g/cc.

The polyolefin elastomers advantageously have a density of more than 0.85 g/cc and more preferably still more than 0.86 g/cc.

The density of the polyolefin elastomers is measured in accordance with the procedure described in standard ASTM D-792.

In accordance with the present invention, the composition used for crosslinking the polyolefin elastomers comprises at least one monoperoxycarbonate of formula (I) as described above.

Preferably, in the formula (I), $R_1$ represents a branched alkyl radical comprising a number of carbon atoms of less than or equal to 6, and $R_2$ represents a branched alkyl radical.

Preferably, in the formula (I), $R_1$ and $R_2$ are different.

In accordance with the formula (I), $R_1$ is preferably a $C_2$-$C_5$ radical. $R_1$ is preferably a $C_3$ alkyl radical, especially a branched $C_3$ alkyl radical (isopropyl).

In accordance with the formula (I), $R_2$ is preferably a $C_1$-$C_{10}$, preferably $C_4$-$C_8$, alkyl radical. $R_2$ is preferably a $C_5$ or $C_6$ alkyl radical, especially a branched $C_5$ (tert-amyl) or $C_6$ (tert-hexyl) alkyl radical.

Advantageously, $R_1$ is a $C_2$-$C_5$ alkyl radical and $R_2$ is a $C_1$-$C_{10}$ alkyl radical, especially a $C_4$-$C_8$ alkyl radical.

More advantageously, $R_1$ is a $C_3$ alkyl radical and $R_2$ is a $C_5$ or $C_6$ alkyl radical.

The monoperoxycarbonate of formula (I) is preferably selected from the group consisting of tert-amylperoxy isopropyl monocarbonate (TAIC), tert-amylperoxy n-propyl monocarbonate (TAPC), tert-butylperoxy isopropyl monocarbonate (TBIC), tert-octylperoxy isopropyl monocarbonate (TOIC), and tert-hexylperoxy isopropyl monocarbonate (THIC).

The monoperoxycarbonate of formula (I) is preferably selected from the group consisting of tert-amylperoxy isopropyl monocarbonate (TAIC) and tert-hexylperoxy isopropyl monocarbonate (THIC).

The monoperoxycarbonate of formula (I) preferably corresponds to the tert-amylperoxy isopropyl monocarbonate (TAIC) of the following formula:

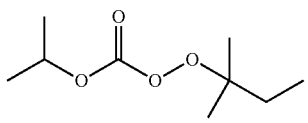

Preferably, in the formula (II), $R_1$ represents a branched alkyl radical comprising a number of carbon atoms of greater than or equal to 7, and $R_2$ represents a branched alkyl radical.

Preferably, in the formula (II), $R_1$ and $R_2$ are different. In accordance with the formula (II), $R_1$ is an alkyl radical comprising a number of carbon atoms of greater than or equal to 7, preferably a $C_7$-$C_{10}$ alkyl radical, more preferably a $C_7$-$C_9$ alkyl radical. $R_1$ is preferably a $C_8$ alkyl radical, especially a branched $C_8$ alkyl radical.

In accordance with the formula (II), $R_2$ is preferably a $C_1$-$C_{10}$, preferably $C_2$-$C_9$, particularly $C_4$-$C_8$, alkyl radical. Preferably, $R_2$ is a $C_4$ or $C_5$ alkyl radical, especially a branched $C_4$ or $C_5$ alkyl radical. More preferably, $R_2$ is a $C_4$ alkyl radical, especially a branched $C_4$ alkyl radical.

Advantageously, $R_1$ is a $C_7$-$C_{10}$ alkyl radical, especially a $C_7$-$C_9$ alkyl radical, and $R_2$ is a $C_1$-$C_{10}$ alkyl radical, especially a $C_2$-$C_9$, particularly $C_4$-$C_8$, alkyl radical.

The monoperoxycarbonate of formula (II) is preferably selected from the group consisting of OO-tert-amyl O-(2-ethylhexyl) monoperoxycarbonate (TAEC), OO-tert-butyl O-(2-ethylhexyl) monoperoxycarbonate (TBEC), OO-tert-octyl O-(2-ethylhexyl) monoperoxycarbonate (TOEC), and OO-tert-hexyl O-(2-ethylhexyl) monoperoxycarbonate (THEC).

The monoperoxycarbonates stated above and in accordance with the invention are available under the trade name Luperox® or Lupersol® as sold by Arkema.

Preferably, the monoperoxycarbonate of formula (II) corresponds to OO-tert-amyl O-(2-ethylhexyl) monoperoxycarbonate (TAEC) or to OO-tert-butyl O-(2-ethylhexyl) monoperoxycarbonate (TBEC), and more particularly to OO-tert-butyl O-(2-ethylhexyl) monoperoxycarbonate (TBEC).

The mass ratio between the monoperoxycarbonate of formula (I) and the monoperoxycarbonate of formula (II) preferably varies in the range from 0.1:99.9 to 80:20, preferably from 1:99 to 70:30 and more preferably from 10:90 to 60:40.

More preferably, the mass ratio between the monoperoxycarbonate of formula (I) and the monoperoxycarbonate of formula (II) is 60:40.

Preferably, in the formula (I), $R_1$ represents a branched alkyl radical comprising a number of carbon atoms of less than or equal to 6 and $R_2$ represents a branched alkyl radical, and, in the formula (II), $R_1$ represents a branched alkyl radical comprising a number of carbon atoms of greater than or equal to 7 and $R_2$ represents a branched alkyl radical.

The invention advantageously concerns the use of tert-amylperoxy isopropyl monocarbonate (TAIC) and a monoperoxycarbonate of formula (II) selected from the group consisting of OO-tert-amyl O-(2-ethylhexyl) monoperoxycarbonate (TAEC), OO-tert-butyl O-(2-ethylhexyl) monoperoxycarbonate (TBEC), OO-tert-octyl O-(2-ethylhexyl) monoperoxycarbonate (TOEC), and OO-tert-hexyl O-(2-ethylhexyl) monoperoxycarbonate (THEC), for crosslinking a polyolefin elastomer.

Preferably, the invention concerns the use of tert-amylperoxy isopropyl monocarbonate (TAIC) and OO-tert-amyl O-(2-ethylhexyl) monoperoxycarbonate (TAEC) or OO-tert-butyl O-(2-ethylhexyl) monoperoxycarbonate (TBEC) for crosslinking a polyolefin elastomer, preferably a copolymer of ethylene and at least one alpha-olefin.

Preferably, the invention concerns the use of tert-amylperoxy isopropyl monocarbonate (TAIC) and OO-tert-butyl O-(2-ethylhexyl) monoperoxycarbonate (TBEC) for crosslinking a polyolefin elastomer.

In accordance with these embodiments, the polyolefin elastomer preferably comprises at least one unit derived from ethylene.

In accordance with these embodiments, the polyolefin elastomer is preferably selected from the group consisting of copolymers of ethylene and alpha-olefin, especially a linear or branched $C_3$-$C_{20}$ alpha-olefin.

Said composition preferably comprises strictly less than 0.4% by weight of a tert-alkyl hydroperoxide, calculated relative to 100 parts by weight of a mixture of monoperoxycarbonate of formula (I) and monoperoxycarbonate of formula (II).

The composition of the invention preferably comprises no tert-alkyl hydroperoxide present in an amount of from 0.4 to less than 4% by weight, calculated relative to 100 parts by weight of a mixture of monoperoxycarbonate of formula (I) and monoperoxycarbonate of formula (II). Said composition is advantageously devoid of a tert-alkyl hydroperoxide present in an amount of from 0.4 to less than 4% by weight, calculated relative to 100 parts by weight of the total monoperoxycarbonate content of the composition.

Particularly, the composition of the invention comprises no tert-alkyl hydroperoxide present in an amount of from 0.4 to less than 4% by weight, calculated relative to 100 parts by weight of a mixture consisting of tert-amylperoxy isopropyl monocarbonate (TAIC) and OO-tert-amyl O-(2-ethylhexyl) monoperoxycarbonate (TAEC).

The tert-alkyl hydroperoxide is preferably selected from the group consisting of t-butyl hydroperoxide (TBHP), t-amyl hydroperoxide (TAHP), t-hexyl hydroperoxide (THHP), 1,1,3,3-tetramethylbutyl hydroperoxide (TOHP), paramenthane hydroperoxide (PMHP), 2,5-dimethyl-2,5-dihydroperoxide (2,5-2,5), and mixtures thereof.

More particularly, the composition is devoid of tert-alkyl hydroperoxide.

Crosslinkable Composition

As indicated above, the crosslinkable composition comprises:
- at least one polyolefin elastomer (preferably a copolymer of ethylene and at least one alpha-olefin) as described above,
- at least one monoperoxycarbonate conforming to the formula (I), as described above, and
- at least one monoperoxycarbonate, conforming to the formula (II) as described above.

Said composition preferably comprises strictly less than 0.4% by weight of a tert-alkyl hydroperoxide, calculated relative to 100 parts by weight of a mixture of monoperoxycarbonate of formula (I) and monoperoxycarbonate of formula (II).

Preferably, the composition is devoid of tert-alkyl hydroperoxide present in an amount of from 0.4 to less than 4% by weight, calculated relative to 100 parts by weight of a mixture of monoperoxycarbonate of formula (I) and monoperoxycarbonate of formula (II).

Preferably, said composition is devoid of a tert-alkyl hydroperoxide present in an amount of from 0.4 to less than 4% by weight, calculated relative to 100 parts by weight of the total monoperoxycarbonate content of the composition.

The monoperoxycarbonates of formulae (I) and (II) are preferably present in the composition in an amount of less than or equal to 3 parts by weight per 100 parts by weight of the polyolefin elastomer.

Accordingly, the amount of monoperoxycarbonates of formulae (I) and (II) is preferably less than or equal to 3 parts by weight per 100 parts by weight of the polyolefin elastomer.

Preferably, the amount of monoperoxycarbonates of formulae (I) and (II) varies in the range from 0.1 to less than 3 parts by weight, preferably from 0.2 to 1.5, more preferably from 0.3 to 1, more preferably from 0.4 to 1, more preferably from 0.4 to 0.7, and more preferably still approximately 0.5 parts by weight, per 100 parts by weight of the polyolefin elastomer.

The crosslinkable composition advantageously comprises a polyolefin elastomer, tert-amylperoxy isopropyl monocarbonate (TAIC) and a monoperoxycarbonate of formula (II) selected from the group consisting of OO-tert-amyl O-(2-ethylhexyl) monoperoxycarbonate (TAEC), OO-tert-butyl O-(2-ethylhexyl) monoperoxycarbonate (TBEC), OO-tert-octyl O-(2-ethylhexyl) monoperoxycarbonate (TOEC) and OO-tert-hexyl O-(2-ethylhexyl) monoperoxycarbonate (THEC).

The crosslinkable composition preferably comprises a polyolefin elastomer, tert-amylperoxy isopropyl monocarbonate (TAIC), and OO-tert-butyl O-(2-ethylhexyl) monoperoxycarbonate (TBEC).

Alternatively, the crosslinkable composition preferably comprises a polyolefin elastomer, tert-amylperoxy isopropyl monocarbonate (TAIC), and OO-tert-amyl O-(2-ethylhexyl) monoperoxycarbonate (TAEC).

More preferably still, the polyolefin elastomer is preferably selected from the group consisting of copolymers of ethylene and alpha-olefin, especially copolymers of ethylene and linear or branched $C_3$-$C_{20}$ alpha-olefin.

The mass ratio between the monoperoxycarbonate of formula (I) and the monoperoxycarbonate of formula (II) is preferably 60:40.

The crosslinkable composition of the invention may further comprise at least one coagent, which is not an organic peroxide.

Said coagent advantageously comprises at least one carbamate, maleimide, acrylate, methacrylate, or allyl functional group. Allyl carboxylates may be used, and may be selected from the group consisting of allyl, diallyl, and triallyl types.

Said coagent may be selected from the group consisting of divinylbenzene, diisopropenylbenzene, alpha-methylstyrene, alpha-methylstyrene dimer, ethylene glycol dimethacrylate, phenylene dimethacrylate, diethylene glycol dimethacrylate, triethylene glycol dimethacrylate, tetraethylene glycol dimethacrylate, polyethylene glycol 200 dimethacrylate, polyethylene glycol 400 dimethacrylate, 1,3-butanediol dimethacrylate, 1,4-butanediol dimethacrylate, 1,6-hexanediol dimethacrylate, 1,12-dodecanediol dimethacrylate, glycerol 1,3-dimethacrylate, diurethane dimethacrylate, trimethylolpropane trimethacrylate, bisphenol A epoxy diacrylate, dipropylene glycol diacrylate, tripropylene glycol diacrylate, polyethylene glycol 600 diacrylate, ethylene glycol diacrylate, diethylene glycol diacrylate, triethylene glycol diacrylate, tetraethylene glycol diacrylate, neopentyl glycol ethoxylate diacrylate, butanediol diacrylate, hexanediol diacrylate, aliphatic urethane diacrylate, trimethylolpropane triacrylate, trimethylolpropane ethoxylate triacrylate, trimethylolpropane propoxylate triacrylate, glycerol propoxylate triacrylate, aliphatic urethane triacrylate, trimethylolpropane triacrylate and dipentaerythritol pentaacrylate, triallyl cyanurate (TAC), triallyl isocyanurate, N,N'-m-phenylenedimaleimide, butadiene, chloroprene, and isoprene.

More preferably, the coagent is selected from the group consisting of the following: triallyl cyanurate, triallyl isocyanurate, N,N'-m-phenylenedimaleimide, triallyl trimellitate, trimethylolpropane triacrylate, and trimethylolpropane trimethacrylate, and preferably is selected from the group consisting of the following: triallyl cyanurate (TAC), triallyl isocyanurate, trimethylolpropane triacrylate (TMPTA), and trimethylolpropane trimethacrylate (TMPTMA), and more preferably still is triallyl isocyanurate.

Said coagent may be present at from 0.05% to 30%, preferably from 0.1% to 10%, by weight, relative to the total weight of the composition.

The principal objective of using a coagent in the crosslinkable composition of the invention is to increase the crosslinking rate. This coagent also enables a reduction in residual gas emission during the decomposition of said peroxides, and ultimately a reduction in the number of bubbles in the encapsulating material.

The mass ratio of monoperoxycarbonates to crosslinking coagent is preferably in the range from 1:10 to 10:1, most preferably from 1:3 to 3:1.

The crosslinkable composition of this invention may further comprise one or more additives such as coupling agents, UV stabilizers, UV absorbers, fillers, plasticizers, flame retardants, antioxidants, dyes, organic or mineral pigments, and mixtures thereof. Examples of coupling agents are monoalkyl titanates, (vinyl)trichlorosilanes, and (vinyl)trialkoxysilanes. They may represent from 0.01 to 5% by weight, relative to the weight of ethylene polymer.

The UV stabilizers may be selected from hindered amine light stabilizers (HALS), while the UV absorbers may be selected, for example, from benzophenones, triazines, and benzotriazoles. These compounds may represent from 0.01 to 3% by weight, relative to the weight of ethylene polymer.

Inorganic fillers such as silicon dioxide, alumina, talc, and calcium carbonate may be added to enhance the mechanical strength, although nanometric clays are preferred on account of the transparency they confer.

Organic or mineral pigments may also be added for coloring the crosslinkable composition. Mention may be made in particular of titanium dioxide, making it possible to produce a white color, which is particularly useful when the composition is employed for manufacturing a film which is used at the rear face of photovoltaic panels.

Examples of plasticizers are paraffinic or aromatic mineral oils, phthalates, azelates, adipates, and the like.

The antioxidants may be phenolic, phosphate, or sulfur antioxidants. As a variant, quinolines such as 1,2-dihydro-2,2,4-trimethylquinoline may be used as antioxidant.

According to one preferred embodiment, the total amount of peroxide in the crosslinkable composition is less than 3 parts by weight per 100 parts by weight of the polyolefin elastomer, more preferably less than 1.5 parts by weight per 100 parts by weight of the polyolefin elastomer.

More preferably, the crosslinkable composition consists of a polyolefin elastomer as described above, a monoperoxycarbonate of formula (I), and a monoperoxycarbonate of formula (II), as described above, and optionally of at least one of the following additives: a coupling agent, a UV stabilizer, a UV absorber, a filler, a plasticizer, a flame retardant, an antioxidant, a dye, a coagent, and mixtures thereof.

The crosslinkable composition of the invention preferably comprises a polyolefin elastomer as described above, a monoperoxycarbonate of formula (I), and a monoperoxycarbonate of formula (II) as described above, a coupling agent, and a coagent.

Use of the Monoperoxycarbonate of Formula (II)

The invention is also directed to the use of a monoperoxycarbonate of formula (II), as described above, for reducing the risks of premature crosslinking of a composition comprising at least one polyolefin elastomer (preferably a copolymer of ethylene and at least one alpha-olefin), as described above, and at least one monoperoxycarbonate of formula (I) as defined above.

Expressed alternatively, the monoperoxycarbonate of formula (II) allows an increase in the scorch time of a composition comprising at least one polyolefin elastomer (preferably a copolymer of ethylene and at least one alpha-olefin) and at least one monoperoxycarbonate of formula (I).

Method for Producing the Crosslinkable Composition

The present invention likewise relates to a method for producing the crosslinkable composition as defined above, comprising a step of mixing at least one polyolefin elastomer (preferably at least one copolymer of ethylene and at least one alpha-olefin) as described above, at least one monoperoxycarbonate of formula (I) as described above, and at least one monoperoxycarbonate, different from the monoperoxycarbonate of formula (I), conforming to the formula (II) as described above.

The mixing step may advantageously be implemented in conventional devices such as continuous mixers and mixer-extruders, preferably at a temperature below the degradation temperature of the monoperoxycarbonates of the invention.

Method for Producing a Material from the Crosslinkable Composition

The invention likewise concerns a method for producing a material, comprising (a) at least one step of crosslinking (or of curing) a crosslinkable composition as defined above.

The material preferably comprises a polyolefin elastomer comprising at least one unit obtained from ethylene.

The material is especially selected from the group consisting of an encapsulating material, particularly a material for encapsulating solar cells, wire and cable insulation, pipes and hoses (including those for automobile radiators, potable water, and underfloor heating, for example), roller coatings, rotational moldings, cellular articles, and shoe soles.

The material is advantageously a material for encapsulating solar cells.

The crosslinking (or curing) step preferably consists of a laminating step.

The crosslinking step (a) is preferably implemented at a temperature of from 130 to 250° C., preferably from 130 to 180° C., more preferably of from 140 to 165° C.

Said crosslinking step (a) is preferably implemented for a time of from 8 to 30 minutes, more preferably from 12 to 25 minutes.

Said process preferably comprises a step prior to and/or simultaneous with (a') the crosslinking step (a), selected from the group consisting of molding, extrusion, and injection-molding the composition as defined above. When the material is a material for encapsulating solar cells, said step is preferably an extrusion step.

Step (a') may be conducted so as to produce a sheet having a thickness of from 50 to 2000 µm, preferably from 100 to 1000 µm, for example.

Said step (a') may be conducted with a T-die extruder or, as a variant, with a twin-screw extruder coupled to a two-roll mill.

Step (a') is preferably conducted at a temperature of from 80 to 150° C., more preferably from 90 to 120° C.

There is preferably no crosslinking obtained during step (a').

In one particular embodiment, steps (a') and (a) are conducted in a single step.

Method for Producing a Photovoltaic Module

According to one embodiment, the present invention concerns a method for producing a photovoltaic module, comprising:

(i) at least one step of laminating an assembly comprising in succession:
 a first, transparent layer forming the front face of a photovoltaic module,
 a layer obtained from the crosslinkable composition of the invention,
 a plurality of solar cells disposed side by side and connected electrically to one another,
 a layer obtained from the crosslinkable composition of the invention,
 a second layer or a multilayer assembly forming the rear face (or backing) of the module,
(ii) at least one step of pressing the layers laminated together during step (i).

The first layer, forming the front face of the photovoltaic module, may be a sheet of glass or a sheet of poly(methyl methacrylate) (PMMA).

The second layer, forming the rear face of the module, may be a sheet of thin glass or a sheet of poly(methyl methacrylate) (PMMA).

Alternatively, the multilayer assembly forming the rear face of the module is composed of a film of electric-insulation polymer, such as polyethylene terephthalate (PET) or polyamide (PA), on top of which there are one or more films based on fluoropolymers, such as polyvinyl fluoride (PVF) or polyvinylidene fluoride (PVDF), on top of which layer(s) there may be a film of metal, for example of aluminum.

In a variant, the multilayer assembly forming the rear face of the module is composed of a sheet of glass on top of which there is a material comprising a polyolefin elastomer obtainable by the method described above.

The solar cells consist preferably of crystalline silicon or of organic photovoltaic substances.

The layers obtained from the crosslinkable composition of the invention are preferably sheets.

The pressing step may be implemented by conventional techniques, with heating and/or under vacuum, for example at a temperature of 130 to 250° C., preferably of 130 to 180° C., more preferably of 140 to 165° C. under vacuum, for a cure time which may vary in the range from 8 to 30 minutes, for example from 8 to 25 minutes. The composition of the invention may be crosslinked during this pressing step or subsequently.

The method preferably comprises a single, simultaneous step of pressing and of curing (or crosslinking).

Material Based on Polyolefin Elastomer

Likewise, another subject of the invention relates to a material comprising at least one polyolefin elastomer (preferably a copolymer of ethylene and at least one alpha-olefin) which is obtainable by the method described above.

The material obtained is preferably selected from the group consisting of an encapsulating material, particularly a material for encapsulating solar cells, wire and cable insulation, pipes and hoses (including those for automobile radiators, potable water, and underfloor heating, for example), roller coatings, rotational moldings, and cellular articles, and shoe soles.

The material is advantageously an encapsulating material, and more preferably still a material for encapsulating solar cells.

More advantageously, the encapsulating material is a transparent film disposed between the solar cells and the glass panel forming the front face of a photovoltaic module (upper glass panel), or a transparent or tinted film disposed between the glass panel forming the rear face of the module (lower glass panel) and the solar cells in the case of double-glass processes.

Hence the material is preferably used in a method for producing a photovoltaic module, especially in a double-glass process.

More preferably, the material comprising a polyolefin elastomer is a film, especially a film of ethylene polymer, particularly of linear and uniformly branched copolymers of ethylene and alpha-olefin.

The material of the invention has an improved crosslinking density and also a marked reduction in, or even absence of, scorch problems. This allows films to be obtained which do not have any surface defects and which exhibit a high resistivity.

Photovoltaic Module

The invention likewise relates to a photovoltaic module comprising at least one material for encapsulating solar cells as described above.

Particularly, the photovoltaic module of the invention comprises at least:
a first, transparent layer forming the front face of the photovoltaic module and intended to receive a luminous flux,
a material encapsulating, as described above, a plurality of solar cells disposed side by side and connected electrically to one another,
a second layer or a multilayer assembly, forming the rear face (or backing) of the photovoltaic module;
the material encapsulating the plurality of solar cells being situated between the first layer and the second layer or the multilayer assembly.

The examples that follow serve to illustrate the invention without, however, being limiting in nature.

EXAMPLE

Example 1

The following compositions were prepared by mixing:
a polyolefin elastomer (KST340T from Japan Polyethylene Corporation, MFI 12-16 g/10 min with a load of 5 kg; melting point of 55-70° C., measured by DSC),
tert-amylperoxy isopropyl monocarbonate (Luperox® TAIC sold by Arkema),
the same polyolefin elastomer, but with OO-tert-butyl O-isopropyl monoperoxycarbonate (Luperox® TBIC sold by Arkema),
the same polyolefin elastomer, but with tert-amylperoxy isopropyl monocarbonate (TAIC) and OO-tert-amyl O-(2-ethylhexyl) monoperoxycarbonate (TAEC) in a mass ratio of 60:40,
the same polyolefin elastomer, but with tert-amylperoxy isopropyl monocarbonate (TAIC) and OO-tert-butyl O-(2-ethylhexyl) monoperoxycarbonate (TBEC) in a mass ratio of 60:40,
the same polyolefin elastomer, but with OO-tert-amyl O-(2-ethylhexyl) monoperoxycarbonate (TAEC),
the same polyolefin elastomer, but with OO-tert-butyl O-(2-ethylhexyl) monoperoxycarbonate (TBEC).

The compositions were thus prepared in a Haake internal mixer at a temperature of 35° C. for a time of 12 minutes, using a rotary speed of 50 revs/min. The polymer mixture is subsequently passed through an open mill regulated to a temperature of 50° C., to produce sheets approximately 2 mm in thickness.

Samples of approximately 2 to 3 grams of the compositions above are applied to a plate on a moving die rheometer (MDR) supplied by GOTECH, which is capable of measuring the curing properties of the samples and includes software for analyzing the results. Each of the samples is placed in a temperature-controlled cavity between two dies, the lower of which oscillates so as to apply a cyclical stress or deformation to the sample, while the upper die is connected to a torque sensor for measuring the torque response of the sample to the deformation.

The stiffness is recorded continuously as a function of the time. The stiffness of the sample increases in line with the vulcanization which occurs.

This instrument is capable of providing, among other data, calculated values of ML (minimum torque), MH (maximum torque, which, when it is attained, also defines the time required for the attainment of the cure state), tc10 (time before 10% of cure state), and tc90 (time before 90% of cure state), as defined by the international standards (ASTM D5289 and ISO 6502).

The MDR is activated at a temperature of 115° C. and of 145° C. with an amplitude of oscillation (degree of deformation) of 0.5° applied to the sample for 30 minutes. The scorch time is defined as the time needed to reach 10% of the total curing, i.e., tc10.

This test is conducted on the following samples, in which the amounts of monoperoxycarbonate are indicated in parts per hundred parts of POE (phr):

| Composition | Content | MH (dN,m) at 115° C. | MH-ML (dN,m) at 145° C. | tc10 (m:s) at 145° C. | tc90 (m:s) at 145° C. |
|---|---|---|---|---|---|
| TAIC | 0.5 phr | 0.38 | 1.73 | 01:50 | 14:20 |
| TBIC | 0.5 phr | 0.31 | 1.66 | 02:45 | 20:00 |
| 60% TAIC + 40% TAEC | 0.5 phr | 0.32 | 1.7 | 02:02 | 16:10 |
| 60% TAIC + 40% TBEC | 0.5 phr | 0.29 | 1.68 | 02:15 | 17:50 |
| TAEC | 0.5 phr | 0.3 | 1.35 | 02:20 | 17:30 |
| TBEC | 0.5 phr | 0.29 | 1.1 | 03:00 | 22:00 |

The use of TBIC leads to a POE crosslinking rate which is too slow, given that the crosslinking time (tc90) is 20 min, which is unsatisfactory industrially.

The use of TAIC allows an increase in the POE crosslinking rate relative to TBIC and a slight improvement in the crosslinking density (MH-ML). However, the scorch time (tc10) causes problems and may give rise to risks from an industrial standpoint, especially by creating roughenings on the surface of the encapsulating material.

The use of TBEC leads to polymer crosslinking times (tc90) which are too great. Moreover, the use of TAEC and TBEC leads to an insufficient crosslinking density (MH-ML).

The use of a mixture of TAIC and TAEC makes it possible both to accelerate the crosslinking of the POE, relative to the formulation containing only TBIC or only TBEC (tc90), and to retain a good crosslinking density, better than with TAEC or TBEC, while providing protection from the risks of premature crosslinking by virtue of an extension to the scorch time (tc10) relative to the formulation containing only TAIC.

Similarly, the use of a mixture of TAIC and TBEC makes it possible both to accelerate the crosslinking of the POE relative to the formulation containing only TBIC or only TBEC (tc90), and to retain a good crosslinking density, while providing protection from the risks of premature crosslinking, by virtue of an extension to the scorch time (tc10) relative to the formulation containing only TAIC.

The invention claimed is:

1. A mixed organic peroxide composition for use in crosslinking a polyolefin elastomer, the composition comprising:
at least one monoperoxycarbonate conforming to the formula (I):

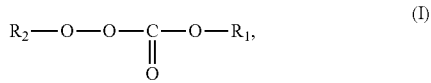

wherein in formula (I) $R_1$ represents an alkyl radical comprising a number of carbon atoms of less than or equal to 6, and $R_2$ represents an alkyl radical, and
at least one monoperoxycarbonate, conforming to the formula (II):

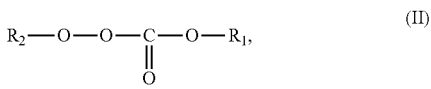

wherein in formula (II) $R_1$ represents an alkyl radical comprising a number of carbon atoms of greater than or equal to 7, and $R_2$ represents an alkyl radical,
wherein the polyolefin elastomer is a copolymer of ethylene and at least one alpha-olefin.

2. The composition as claimed in claim 1, wherein the composition comprises strictly less than 0.4% by weight of a tert-alkyl hydroperoxide, calculated relative to 100 parts by weight of a mixture of monoperoxycarbonate of formula (I) and monoperoxycarbonate of formula (II).

3. The composition as claimed in claim 1, wherein the polyolefin elastomer is selected from the group consisting of ethylene/propylene copolymers, ethylene/1-butene copolymers, ethylene/1-hexene copolymers, ethylene/1-octene copolymers, ethylene/styrene copolymers, ethylene/propylene/1-octene copolymers, ethylene/propylene/1-butene copolymers, ethylene/1-butene/1-octene copolymers, and ethylene/1-butene/styrene copolymers.

4. The composition as claimed in claim 1, wherein the polyolefin elastomer is selected from the group consisting of linear and uniformly branched copolymers of ethylene and alpha-olefin.

5. The composition as claimed in claim 1, wherein, in the formula (I), $R_1$ is a $C_2$-$C_5$ alkyl radical.

6. The composition as claimed in claim 1, wherein, in the formula (I), $R_2$ is a $C_1$-$C_{10}$ alkyl radical.

7. The composition as claimed in claim 1, wherein the monoperoxycarbonate of formula (I) is selected from the group consisting of tert-amylperoxy isopropyl monocarbonate (TAIC), tert-butylperoxy isopropyl monocarbonate (TBIC), tert-octylperoxy isopropyl monocarbonate (TOIC), and tert-hexylperoxy isopropyl monocarbonate (THIC).

8. The composition as claimed in claim 1, wherein, in the formula (II), $R_1$ is a $C_7$-$C_{10}$ alkyl radical.

9. The composition as claimed in claim 1, wherein, in the formula (II), $R_2$ is a $C_1$-$C_{10}$ alkyl radical.

10. The composition as claimed in claim 1, wherein the monoperoxycarbonate of formula (II) is selected from the group consisting of OO-tert-amyl O-(2-ethylhexyl) monoperoxycarbonate (TAEC), OO-tert-butyl O-(2-ethylhexyl) monoperoxycarbonate (TBEC), OO-tert-octyl O-(2-ethylhexyl) monoperoxycarbonate (TOEC), and OO-tert-hexyl O-(2-ethylhexyl) monoperoxycarbonate (THEC).

11. The composition as claimed in claim 1, wherein the mass ratio between the monoperoxycarbonate of formula (I) and the monoperoxycarbonate of formula (II) varies in the range from 1:99 to 70:30.

12. A crosslinkable composition comprising:
at least one polyolefin elastomer, which is a copolymer of ethylene and at least one alpha-olefin,
at least one monoperoxycarbonate of formula (I) as defined in claim 1,
at least one monoperoxycarbonate of formula (II) as defined in claim 1;
the composition comprising preferably strictly less than 0.4% by weight of a tert-alkyl hydroperoxide, calculated relative to 100 parts by weight of the mixture of monoperoxycarbonate of formula (I) and monoperoxycarbonate of formula (II).

13. The crosslinkable composition as claimed in claim 12, wherein the amount of monoperoxycarbonates of formulae (I) and (II) is less than or equal to 3 parts by weight per 100 parts by weight of the polyolefin elastomer.

14. The crosslinkable composition as claimed in claim 12, wherein it further comprises at least one coagent other than an organic peroxide.

15. The composition as claimed in claim 1, wherein the composition is devoid of a tert-alkyl hydroperoxide present in an amount of from 0.4 to less than 4% by weight, calculated relative to 100 parts by weight of a mixture of monoperoxycarbonate of formula (I) and monoperoxycarbonate of formula (II), particularly calculated relative to 100 parts by weight of the total monoperoxycarbonate content of the composition.

16. The composition as claimed in claim 1, wherein the composition is devoid of a tert-alkyl hydroperoxide.

17. A method for producing a material, comprising (a) at least one step of crosslinking a crosslinkable composition as defined in claim 12.

18. The method as claimed in claim 17, wherein the material is selected from the group consisting of an encapsulating material.

19. The method as claimed in claim 17, wherein the crosslinking step (a) is implemented at a temperature of from 130 to 250° C.

20. The method as claimed in claim 17, further comprising a step (a') prior to and/or simultaneous with step (a), wherein step (a') is selected from the group consisting of molding, extrusion, and injection-molding of the crosslinkable composition.

21. A material comprising at least one polyolefin elastomer, obtainable by the method as defined in claim 17.

22. A method for producing a photovoltaic module, comprising:
- (i) at least one step of laminating an assembly comprising in succession:
  - a first, transparent layer forming the front face of a photovoltaic module,
  - a layer obtained from the crosslinkable composition as defined in claim 12,
  - a plurality of solar cells disposed side by side and connected electrically to one another,
  - a layer obtained from the crosslinkable composition as defined in claim 12,
  - a second layer or a multilayer assembly forming the rear face (or backing) of the module; and
- (ii) at least one step of pressing the layers laminated together during step (i).

* * * * *